United States Patent [19]

Henke

[11] 4,004,170

[45] Jan. 18, 1977

[54] MOSFET LATCHING DRIVER

[75] Inventor: John David Henke, Catlett, Va.

[73] Assignee: International Business Machines Corporation, Armonk, N.Y.

[22] Filed: Apr. 29, 1975

[21] Appl. No.: 572,761

[52] U.S. Cl. .......................... 307/279; 307/235 F; 307/247 R; 307/270

[51] Int. Cl.² ................ H03K 3/286; H03K 3/353; H03K 5/20; H03K 17/56

[58] Field of Search .......... 307/279, 247, 205, 214, 307/270, DIG. 3, 235 F, 235 H

[56] References Cited

UNITED STATES PATENTS

| | | | |
|---|---|---|---|
| 3,697,775 | 10/1972 | Kane | 307/205 X |
| 3,775,693 | 11/1973 | Proebsting | 307/205 X |
| 3,778,783 | 12/1973 | Proebsting et al. | 307/279 X |
| 3,870,901 | 3/1975 | Smith et al. | 307/279 X |
| 3,893,087 | 7/1975 | Baker | 340/173 R X |
| 3,902,082 | 8/1975 | Proebsting et al. | 307/279 |

OTHER PUBLICATIONS

Atwood, "Field Effect Transistor Circuits," *IBM Tech. Discl. Bull.*, vol. 6, No. 9, Feb. 1964, pp. 91–93.
Lohman, "Applications of MOSFETs in Microelectronics", *SCP and Solid-State Technology*, pp. 23–29, Mar. 1966.
Baitinger, "Self–Restoring Six–Device FET Memory Cell", *IBM Tech. Discl. Bull.*, vol. 14, No. 4, pp. 1340–1341, Sept. 1971.

*Primary Examiner*—John S. Heyman
*Assistant Examiner*—Larry N. Anagnos
*Attorney, Agent, or Firm*—John E. Hoel

[57] ABSTRACT

An MOSFET latching driver circuit is disclosed which employs a depletion mode FET load bistable latch whose first node drives a depletion mode FET device and whose second node drives an enhancement mode FET device which are interconnected in a push-pull driver circuit. The latching driver has a reduced size when laid out in an integrated circuit and operates at a high speed.

3 Claims, 2 Drawing Figures

MOSFET LATCHING DRIVER

BACKGROUND OF THE INVENTION

The invention relates to logic switching circuitry employing MOSFET devices and in particular relates to an improved MOSFET latching driver circuit operated in the push-pull mode with depletion mode and enhancement mode FET devices.

One reason for the greater performance per unit cost and per unit volume of present day electronic data processing systems has been the advent of the use of MOSFET devices in large scale integrated circuitry. When MOSFET devices are employed, usually the P-channel enhancement mode type of device is used because of its resistance to surface inversion. However, N-channel enhancement mode devices have certain inherent advantages such as higher speed due to a higher change carrier mobility.

A simple bistable circuit can be made by connecting the output of a first inverter to the input of the second inverter and taking the output of the second inverter and connecting it to the input of the first inverter. Bistable driver circuits employing a push-pull driver have been embodied in complementary MOSFET devices, in the prior art. Complementary inverter having an N-channel enhancement mode transistor connected to the negative voltage supply and a P-channel enhancement mode transistor connected to the positive voltage supply have been employed as the basic inverter with the common drain/source, the output node. Common drain output node of the first CMOS inverter is connected to the common gates of a second CMOS inverter and the common drain output of that second CMOS inverter is connected to the common gates of the first CMOS inverter. This forms the basic bistable circuit. A third CMOS inverter has its common gates connected to the common drain output of one of the inverters in the basic bistable circuit so as to form a push-pull output driver for the combined latching driver circuit. In a CMOS inverter, the gates of the transistors are connected together and receive the input signal. When the input signal is negative, the N-channel enhancement mode device is turned off, the P-channel enhancement mode device is turned on, and the output is at the level of the positive supply voltage. When the input signal is positive, the N-channel device is on, the P-channel device is off, and the output is at the level of the negative supply voltage. Such a complementary latching driver circuit provides good switching characteristics and requires only one supply voltage. However, the use of both N-channel and P-channel enhancement devices requires an unusually large amount of surface area on the integrated circuit chip, and also requires several additional processing steps which significantly increases the cost of the circuit.

OBJECT OF THE INVENTION

It is an object of the invention to provide an MOSFET latching driver circuit having good switching characteristics and which occupies a smaller space per unit power, when laid out than was available in the prior art.

It is another object of the invention to provide a MOSFET latching driver circuit having good switching characteristics which requires a more simplified process for fabrication than was possible in the prior art.

SUMMARY OF THE INVENTION

These and other objects of the invention are accomplished by the MOSFET latching driver circuit disclosed herein. First depletion mode FET device serving as a load has its drain connected to a supply voltage and its source connected to a first node. A first enhancement mode FET device has a drain connected to the first node, a source connected to ground potential, and a gate connected to a second node. A second depletion mode FET device serving as a load has a drain connected to the supply voltage, and a source connected to the second node. A second enhancement mode FET device has a drain connected to the second node, a source connected to the ground potential and a gate connected to the first node. The first enhancement mode and the first deletion mode devices constitute a first inverter and the second enhancement mode and the second depletion mode devices constitute a second inverter with the inputs and outputs of the first and second inverters being cross coupled so as to operate as a bistable latching circuit. A third depletion mode FET device has a drain connected to supply voltage, a source connected to an output node, and a gate connected to the first node of the first inverter in the bistable circuit. A third enhancement mode FET device has a drain connected to the output node, a source connected to the ground potential and a gate connected to the second output node of the second inverter in the bistable latching circuit. When an input signal to the first or the second nodes of the first or the second inverters appears, that signal will be latched by the bistable latching circuit and the sense of the latched state of the bistable circuit will then be amplified by the push-pull driver circuit embodied in the third depletion mode and third enhancement mode FET devices. By this means, the latching driver function can be performed at a high speed on a smaller surface area of the integrated circuit than was available in the prior art. The circuit may be produced by a process which is simpler than that necessary to produce the same function in the prior art.

DISCUSSION OF THE FIGURES

The foregoing and other objects, features and advantages of the invention will be apparent from the following more particular description of the preferred embodiments of the invention, as illustrated in the accompanying drawings.

DISCUSSION OF THE PREFERRED EMBODIMENT

The MOSFET devices disclosed herein are field effect transistors fabricated by diffusing spaced, N type source and drain regions into an P type substrate, forming an insulating gate such as silicon dioxide over the channel region between the source and drain regions, and then forming a conductive gate electrode over the channel region. This type of device is an enhancement mode N-channel transistor. Assuming that the source region of such a device is at ground potential, and that the drain region is biased to a positive voltage, the device will conduct whenever the gate to source voltage $V_{GS}$ is more positive than the threshold voltage $V_T$ of the device, where $V_T$ is always a positive value. When the magnitude of $V_{GS}$ is less than $V_T$, no significant conduction will occur.

The circuits disclosed herein also utilize N-channel, depletion mode MOSFET devices which have the same configuration as above, but have a N-channel between the diffused regions produced by the process of ion implantation. The process for the implantation of N-channel devices is disclosed in L. Forbes, *IEEE Journal of Solid State Electronics*, June 1973, pages 226–230. The ion implantation process for P-channel MOSFET devices is disclosed in M. Hswe, et al, *Solid State Electronics*, 1972, Volume 15, pages 1237–1243. As a result, the depletion mode devices conduct whenever the gate to source voltage $V_{GS}$ is more positive than the pinch off voltage $V_P$ of the device, where $V_P$ is always negative. In order to stop conduction, the gate voltage with respect to the source voltage must be more negative than the pinch off voltage. Thus, if the gate is at the same potential as the source, the device nevertheless continues to conduct.

It is to be understood that the present invention is equally applicable to P-channel transistors as it is to the disclosed N-channel transistor embodiment. The P-channel enhancement mode and depletion mode devices operate in the same way as the corresponding N-channel enhancement and depletion mode devices, with the exception that the polarity of the voltages is reversed. Accordingly, as disclosed herein, the term low voltage refers to the source which is shown as ground potential and the term high voltage refers to the drain voltage which is a negative voltage for P-channel devices and a positive voltage for N-channel devices. Occasionally it will also be convenient to refer to the higher or drain voltage levels as the logical one level, which for a P-channel device would typically be from −5 volts to −17 volts and for N-channel devices would typically be from +5 volts to +17 volts. Similarly, the source, ground or lower voltage levels will be occasionally referred to as the logical zero level; typically 0 to 2.2 volts, positive for N-channel and negative for P-channel.

Figure 1:
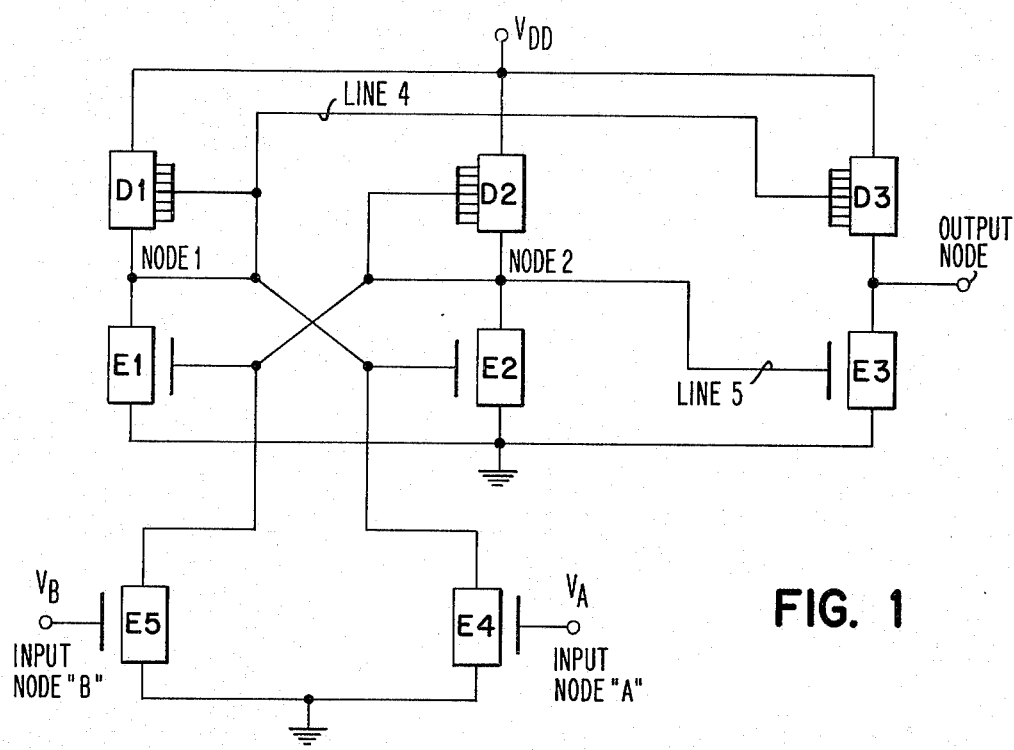
FIG. 1 shows a schematic diagram of the latching driver circuit invention.

FIG. 1 illustrates the latching driver invention. Depletion mode transistor D1 has its drain connected to the drain voltage $V_{DD}$, its source connected to node 1 and its gate connected to node 1. Enhancement mode FET device E1 has its drain connected to node 1, its source connected to ground potential, and its gate connected to node 2. Depletion mode device D2 has its drain connected to the supply voltage $V_{DD}$, its source connected to node 2, and its gate connected to node 2. Enhancement mode device E2 has its drain connected to node 2, its source connected to the ground potential, and its gate connected to node 1. It is seen that the MOSFET devices D1 and E1 constitute a first inverter with an input node B on the gate of E5 and an output at node 1. Similarly, the MOSFET devices D2 and E2 constitute an inverter with the input node A at the gate of E4 and output at node 2. The cross coupled relationship between the inverter comprised of D1 and E1 and the inverter comprised of D2 and E2 constitutes a bistable latching circuit. The MOSFET depletion mode device D3 has a drain connected to the supply voltage $V_{DD}$, source connected to the output node, and the gate connected by line four to node 1. The MOSFET enhancement mode device E3 has its drain connected to the output node, its source connected to ground potential, and its gate connected by line five to node 2. The portion of the circuit comprised of devices D3 and E3 is a push-pull driver amplifier, amplifying the sense of the latched state for the bistable latching circuit.

Figure 2:
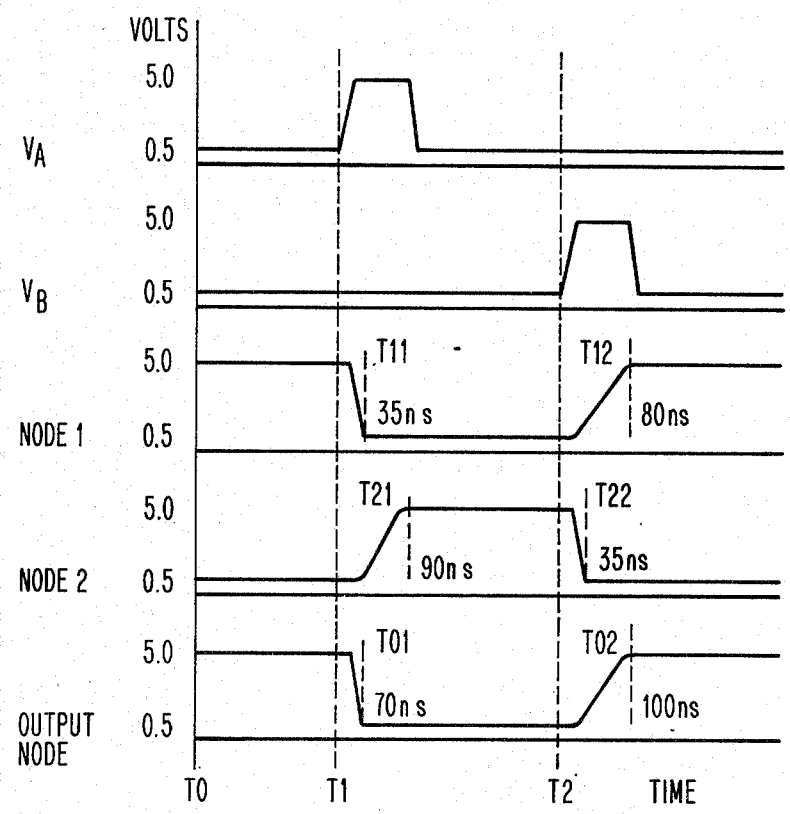
FIG. 2 illustrates the operation of the latching driver by means of waveforms for the input node A, the input node B, node 1, node 2, and the output node.

FIG. 2 illustrates the operation of the latching driver by means of waveforms for the input node A, the input node B, node 1, node 2, and the output node. The waveforms are plotted for N-channel devices, with a drain voltage $V_{DD}$ of +5.0 volts. Between times $T_0$ and $T_1$, current is flowing through the inverter comprised of D2 and E2 and current is not flowing through the inverter comprised of D1 and E1. Thus it is seen that between times $T_0$ and $T_1$, node 1 has a voltage V1 of 5.0 volts, near the drain voltage $V_{DD}$ while node 2 has a potential $V_2$ of 0.5 volts which is near ground. The more positive voltage at node 1 tends to turn the depletion mode device D3 on harder whereas more negative voltage at node 2 turns the enhancement mode device E3 off. This push-pull action at the output driver causes the voltage $V_0$ at the output node to be 5.0 volts, near the drain voltage $V_{DD}$.

At time $T_1$, a positive input signal magnitude $+V_A$ is input to the input node A as shown in FIG. 2. This pulse turns on the enhancement mode N-channel MOSFET device E4. When E4 turns on, node 1 potential $V_1$ makes a negative transition from its original positive potential near $+V_{DD}$ to a potential near ground in a time $T_{11}$ equal to 35 ns. This negative transition at node 1 causes enhancement mode device E2 to turn off thereby causing the potential at node 2 to incur a positive transition to a voltage approximately equal to $+V_{DD}$ in a time $T_{21}$ equal to 90 ns. The positive transition at node 2 is transferred by line five to the enhancement mode device E3 tending to turn E3 on whereas the negative transition of node 1 is transferred by line four to the depletion mode device D3 tending to turn D3 off. Thus the voltage $V_0$ at the output node makes a rapid transition from approximately $+V_{DD}$ to approximately 0.5 volts in a time duration of $T_{01}$ equal to 70 nanoseconds. This state of affairs continues for the duration from T1 to T2.

At time T2 a positive signal pulse is introduced at the input node B turning the enhancement mode device E5 on. The potential at node 2 of $V_2$ makes a negative transition to ground potential during a time period $T_{22}$ of 35 nanoseconds thereby turning the enhancement mode device E1 off. This in turn causes the node 1 potential $V_1$ to make a positive transition from approximately ground potential to approximately $+V_{DD}$ during a time interval $T_{12}$ of 80 nanoseconds. Through the push-pull operation of the output driver, the positive transition on node 1 tends to turn the device D3 on and the negative transition at node 2 tends to turn the enhancement mode device E3 off thereby forcing an amplified positive transition from the output voltage value $V_0$ equal to 0.5 volts to a voltage of approximately $V_{DD}$ in a time on the order of $T_{02}$ equal to 100 nanoseconds.

Thus it is seen that the switching speed for the latching driver circuit is quite fast and approximates the switching speed for complementary MOSFET circuitry. The latching driver invention however has the advantage that it can be laid out in a smaller area in an integrated circuit and can be produced by a process requiring fewer and more simplified steps than those necessary to produce a complementary MOS circuit.

It is to be recognized of course that if the latching driver of FIG. 1 is considered to have a right handed symmetry, a latching driver having a left handed symmetry with node 2 driving the depletion mode device D3 and node 1 driving the enhancement mode device E3 would come within the scope of the invention as disclosed herein.

It is seen that where one node of a simple latch drives an output load, the load need not be very great before the latch operation becomes intolerably slow. Increasing the latch device sizes may speed up the operation but the quiescent power dissipation also increases. This can be compensated for by adjusting the aspect ratio of the first inverter D1 and E1 with respect to the aspect ratio of the second inverter D2 and E2 in the bistable latching circuit. The aspect ratio is the width to length ratio of the active device E1 divided by the width to length ratio of the gate region of the load device D1. The aspect ratio of each half of the latch and also of the output driver D3 and E3 can be adjusted for any desired most positive down level. The circuit can then be optimized for noise immunity for the latch or the output driver. Since the left half of the latch D1 and E1 controls the load device D3 and the right half of the latch D2 and E2 controls the active device E3 in the driver circuit, the output rise and fall times can be tailored as desired. The device sizes of the right and left latch halves can be varied to produce any desired rise and fall time combination. So long as the aspect ratio is maintained, no noise immunity is lost. Since each latch half is adjusted for its load, an unbalanced latch will not result in unbalanced switching time when the state of the latch is changed.

Compensating for unsymmetric load, the output fall and rise time in FIG. 2 shown $T_{01} = 70$ nanoseconds and $T_{02} = 100$ nanoseconds. Unequal rise and fall times are expected assuming both enhance and deplete devices in the latch are equal while the gate capacitance of E3 is greater than D3. However, by enlarging device D2 and E2, or reducing devices D1 and E1, yet keeping the same aspect ratio:

$$\frac{(Width/Length) E1}{(Width/Length) D1} = \frac{(Width/Length) E2}{(Width/Length) D2}$$

The most positive down levels (MPDL) remain the same but the current to charge D3 or D3's gate can be varied. Thus, $T_{01}$ or $T_{02}$ can be varied or made equal as needed and noise immunity determined by MPDL remains unchanged.

Thus it is seen that combining the enhance/deplete latch with the enhance/deplete push-pull driver, combines the speed of the driver with relatively small size of enhance/deplete latch. Combining these two functions reduces the area that would be consumed by the two distinct circuits and by the wiring from one to the other. The circuit enables read only storage, random access memory and shift register output latches to drive large capacitive loads and adjust and equalize the output rise and fall times.

While the invention has been particularly shown and described with reference to the preferred embodiments thereof, it will be understood by those skilled in the art that the foregoing and other changes in form and details may be made therein without departing from the spirit and scope of the invention.

I claim:

1. A MOSFET latching driver circuit having a predetermined down-voltage level and a symmetrical rise-time and fall-time in its output signal waveform and a predetermined level of noise immunity, comprising:
   a first depletion mode FET device serving as a load and having a drain connected to a supply voltage and a gate and a source connected to a first node;
   a first enhancement mode FET device having a drain connected to said first node, a source connected to a ground potential, and a gate connected to a second node;
   a second depletion mode device serving as a load and having a drain connected to said supply voltage and a gate and a source connected to said second node;
   a second enhancement mode FET device having a drain connected to said second node, a source connected to said ground potential, and a gate connected to said first node;
   said first and second enhancement mode and said first and second depletion mode devices comprising a bistable latching circuit;
   said first depletion mode FET device and said first enhancement mode FET device having substantially the same predetermined ratio of gate width-to-length ratios as that for said second depletion mode device and said second enhancement mode device, imparting to said bistable circuit a predetermined noise immunity;
   a third depletion mode FET device having a drain connected to said supply voltage, a source connected to an output node, and a gate connected to said first node;
   a third enhancement mode FET device having a drain connected to said output node, a source connected to said ground potential, and a gate connected to said second node;
   said third enhancement and third depletion mode devices comprising a push-pull driver circuit;
   said gates of said third depletion mode and third enhancement mode FET devices having a predetermined ratio of width-to-length ratios to enable the generation of an output signal waveform having a predetermined down-voltage level by said push-pull driver circuit;
   said gate of said first depletion mode FET device having a predetermined different area dimension from that of said second depletion mode FET device and said gate of said first enhancement mode FET device having a predetermined different area dimension from that of said second enhancement mode FET device to provide a predetermined different magnitude of charging current to said gate of said third depletion mode FET device, with respect to the magnitude of charging current to said gate of said third enhancement mode FET device, to compensate for a difference in the gate capacitance of said third enhancement mode and third depletion mode FET devices, thereby enabling the generation of an output signal waveform having a symmetrical rise-time and fall-time.

2. The MOSFET latching driver circuit of claim 1, wherein said FET devices are P-channel.

3. The MOSFET latching driver circuit of claim 1, wherein said FET devices are N-channel.

* * * * *